(12) United States Patent
Jo

(10) Patent No.: US 12,245,387 B2
(45) Date of Patent: Mar. 4, 2025

(54) MOUNT BRACKET

(71) Applicant: SOLID, INC., Seongnam-si (KR)

(72) Inventor: Woon Yong Jo, Seongnam-si (KR)

(73) Assignee: SOLiD, INC., Seongnam-si (KR)

( * ) Notice: Subject to any disclaimer, the term of this patent is extended or adjusted under 35 U.S.C. 154(b) by 183 days.

(21) Appl. No.: 17/852,871

(22) Filed: Jun. 29, 2022

(65) Prior Publication Data

US 2023/0007794 A1 Jan. 5, 2023

(30) Foreign Application Priority Data

Jun. 30, 2021 (KR) .................. 10-2021-0086091

(51) Int. Cl.
  *H05K 5/02* (2006.01)
  *H01Q 1/24* (2006.01)
  *E05D 7/00* (2006.01)

(52) U.S. Cl.
  CPC ........... *H05K 5/0226* (2013.01); *H01Q 1/246* (2013.01); *H05K 5/0204* (2013.01); *E05D 7/0045* (2013.01); *H04Q 2201/08* (2013.01)

(58) Field of Classification Search
  CPC .. H05K 5/0226; H05K 5/0204; E05D 7/0045; E05D 7/18; H04Q 1/08; H04Q 2201/08; H01Q 1/246; H01Q 1/1228; H01R 13/639; H01R 24/542; H01R 2201/02; H01R 24/40
  See application file for complete search history.

(56) References Cited

U.S. PATENT DOCUMENTS

| | | | | |
|---|---|---|---|---|
| 2,584,173 A | * | 2/1952 | Van Folwer | B42F 17/02 312/308 |
| 2,869,958 A | * | 1/1959 | Hough | H05K 7/16 312/323 |
| 4,649,599 A | * | 3/1987 | Beller | E05D 11/1007 16/319 |
| 6,232,928 B1 | * | 5/2001 | Zimmerman | H01Q 1/1242 343/890 |
| 2015/0167367 A1 | * | 6/2015 | Sawaguchi | E05D 3/18 16/231 |
| 2017/0237160 A1 | * | 8/2017 | Kim | B64G 1/66 343/745 |
| 2020/0267873 A1 | * | 8/2020 | Harel | H05K 5/0204 |

FOREIGN PATENT DOCUMENTS

KR 10-2010-0122256 A 11/2010
KR 10-2185333 B1 12/2020

OTHER PUBLICATIONS

English Translation KR102185333, Choi Jang Hun; Published Dec. 2, 2020 (Year: 2020).*
Extended European Search Report dated Nov. 28, 2022 in EP Application No. 22182107.7.

* cited by examiner

Primary Examiner — Steven T Sawyer
(74) Attorney, Agent, or Firm — Sughrue Mion, PLLC

(57) ABSTRACT

According to one aspect of the disclosure, there is provided a mount bracket for installation of communication device in a structure, the mount bracket including: a bracket body coupled to the structure; a bracket base, to which the communication device is fixed, coupled to the bracket body and rotates to cover the bracket body; and a connection member provided at one end of the bracket body to rotatably connect the bracket base to the bracket body, wherein the bracket base includes an anti-detachment structure for preventing separation from the bracket body during rotation.

6 Claims, 6 Drawing Sheets

(a)

(b)

MOUNT BRACKET

CROSS-REFERENCE TO RELATED APPLICATION

This application claims priority from Korean Patent Application No. 10-2021-0086091, filed on Jun. 30, 2021, in the Korean Intellectual Property Office, the disclosure of which is incorporated herein by reference in its entirety.

BACKGROUND

1. Field

The disclosure relates to a mount bracket, in particular to the mount bracket with an anti-detachment structure, prevents damage to a communication device when the communication device is separated, detached, fallen from the mount bracket, then collides with the ground in the process of installing the communication device on a structure such as a wall or a ceiling using the mount bracket.

2. Description of the Related Art

In general, communication device such as a repeater for mobile communication is an apparatus, destined to provide the best call quality for users by improving call quality or maximizing the reach of radio signals in a shaded area where it is difficult to transmit or receive the radio signals from a base station, amplifies the radio signals in areas where the radio signals are blocked by mountains, buildings, or other topographical features, or in shaded areas where radio signals are difficult to reach, such as tunnels and underground parking lots, and thus, the radio signals can reach the base station.

In particular, the repeater is installed to an upper position such as a wall, ceiling, pylon, and electric pole, where the radio wave environment may be improved, the signals therefore can smoothly transmitted/receipted in shaded areas or radio blocking areas.

In general, a bracket is used to install the repeater in a structure in an upper position, such as a wall, ceiling, etc., and there was a problem that the repeater broke off by detaching from the bracket and colliding with the ground in the process of installing the repeater with the bracket in the structure.

SUMMARY

The inventive concept of the disclosure relates is to provide a mount bracket including an anti-detachment structure that can prevent a breakage of the communication device due to collision with the ground by not separating the communication device from the mount bracket when installing the communication device.

The inventive concept of the disclosure is not limited to the above objectives, but other objectives not described herein may be clearly understood by those of ordinary skilled in the art from descriptions below.

According to an aspect of the disclosure, there is provided a mount bracket for installation of communication device in a structure, the mount bracket including: a bracket body coupled to the structure; a bracket base, to which the communication device is fixed, coupled to the bracket body and rotates to cover the bracket body; and a connection member provided at one end of the bracket body to rotatably connect the bracket base to the bracket body, wherein the bracket base includes an anti-detachment structure for preventing separation from the bracket body during rotation.

According to an exemplary embodiment, the bracket base may include a rib formed at one end of the bracket base; a rotary groove formed in the rib and into which the connection member of the bracket body is rotatably inserted; and a guide groove formed in the rib and configured to guide the connection member to the rotary groove when the connection member is inserted.

According to an exemplary embodiment, the anti-detachment structure may be a latching groove, the latching groove may be formed adjacent to be connected to the rotary groove of the bracket base and in which the connection member is jammed when the bracket base is rotated to prevent detachment of the bracket base.

According to an exemplary embodiment, the latching groove may be formed between the rotary groove and the guide groove in a direction opposite to a rotation direction of the bracket base.

According to an exemplary embodiment, a guide protrusion may be formed between the latching groove and the rotary groove to guide the connection member from the rotary groove to the latching groove when the bracket base is rotated.

According to an exemplary embodiment, the guide protrusion may be formed to be rounded.

According to an exemplary embodiment, a plurality of grooves may be formed along an outer periphery of the guide protrusion.

According to an exemplary embodiment, a fastening screw for fixing the bracket base to the bracket body may be provided on the other end of the bracket body.

In accordance with the inventive concept of the disclosure, it may provide effects to prevent damage to the communication device when the communication device is separated/detached/fallen from the mount bracket, then collides with the ground in the process of installing the communication device on a structure such as a wall or a ceiling.

The effects of the inventive concept are not limited to the above-mentioned effects, and other effects not mentioned will be clearly understood by those skilled in the art from the description of the claims.

BRIEF DESCRIPTION OF THE DRAWINGS

Embodiments of the present disclosure will be described based on the following figures, wherein.

DETAILED DESCRIPTION

Figure 1:
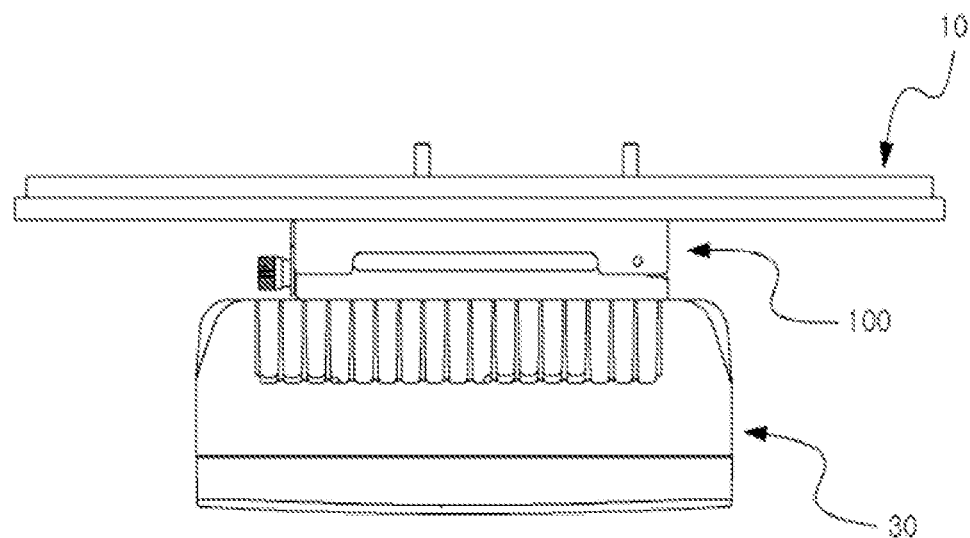
FIG. 1 is a schematic view of a mount bracket according to an example embodiment.

Specific structural or functional descriptions related to embodiments according to the present disclosure and disclosed in the present specification are merely illustrated to describe embodiments of the present disclosure. The embodiments of the present disclosure may be implemented in various forms and should not be interpreted as being limited to the embodiments described in the present specification.

The embodiments according to the present disclosure may be modified in various manners and may have various forms, so that specific embodiments are intended to be illustrated in the drawings and described in detail in the present specification or application. However, it should be understood that those embodiments are not intended to limit the embodiments based on the concept of the present disclosure to specific disclosure forms and they include all changes, equivalents or modifications included in the spirit and scope of the present disclosure.

The terms such as "first" and "second" may be used to describe various components, but those components should not be limited by the terms. The terms are merely used to distinguish one component from other components, and a first component may be designated as a second component and a second component may be designated as a first component in the similar manner, without departing from the scope based on the concept of the present disclosure.

Throughout the entire specification, it should be understood that a representation indicating that a first component is "connected" or "coupled" to a second component may include the case where the first component is connected or coupled to the second component with some other component interposed therebetween, as well as the case where the first component is "directly connected" or "directly coupled" to the second component. In contrast, it should be understood that a representation indicating that a first component is "directly connected" or "directly coupled" to a second component means that no component is interposed between the first and second components. Other representations describing relationships among components, that is, "between" and "directly between" or "adjacent to," and "directly adjacent to," should be interpreted in similar manners.

The terms used in the present specification are merely used to describe specific embodiments and are not intended to limit the present disclosure. A singular expression includes a plural expression unless a description to the contrary is specifically pointed out in context. In the present specification, it should be understood that the terms such as "include" or "have" are merely intended to indicate that features, numbers, steps, operations, components, parts, or combinations thereof are present, and are not intended to exclude a possibility that one or more other features, numbers, steps, operations, components, parts, or combinations thereof will be present or added.

Unless differently defined, all terms used here including technical or scientific terms have the same meanings as the terms generally understood by those skilled in the art to which the present disclosure pertains. The terms identical to those defined in generally used dictionaries should be interpreted as having meanings identical to contextual meanings of the related art, and are not interpreted as being ideal or excessively formal meanings unless they are definitely defined in the present specification.

Hereinafter, the mount bracket 100 according to an embodiment of the present disclosure will be described with reference to the accompanying drawings.

FIG. 1 is a schematic view of a mount bracket 100 according to the present disclosure, and referring to FIG. 1, the mount bracket 100 fixes a communication device 30 to an upper position of a structure 10 such as a wall or a ceiling.

For example, the communication device 30 may be a repeater. The repeater may be a bidirectional repeater, including a donor antenna and a service antenna, installed in the structure 10 to resolve radio-interference in a shaded region or a radio wave blocking area. A base station signal is received by the donor antenna and transmitted to a terminal via the service antenna and the terminal signal is received by the service antenna and transmitted to the base station via the donor antenna. However, the inventive concept of the present disclosure is not limited thereto and the communication device 30 may be a node unit such as a remote unit disposed at each service position in the Distributed Antenna System (DAS), one of in-building solutions.

The mount bracket 100 may include a bracket body 110, a bracket base 130, a connection member 150, and an anti-detachment structure.

Figure 2:
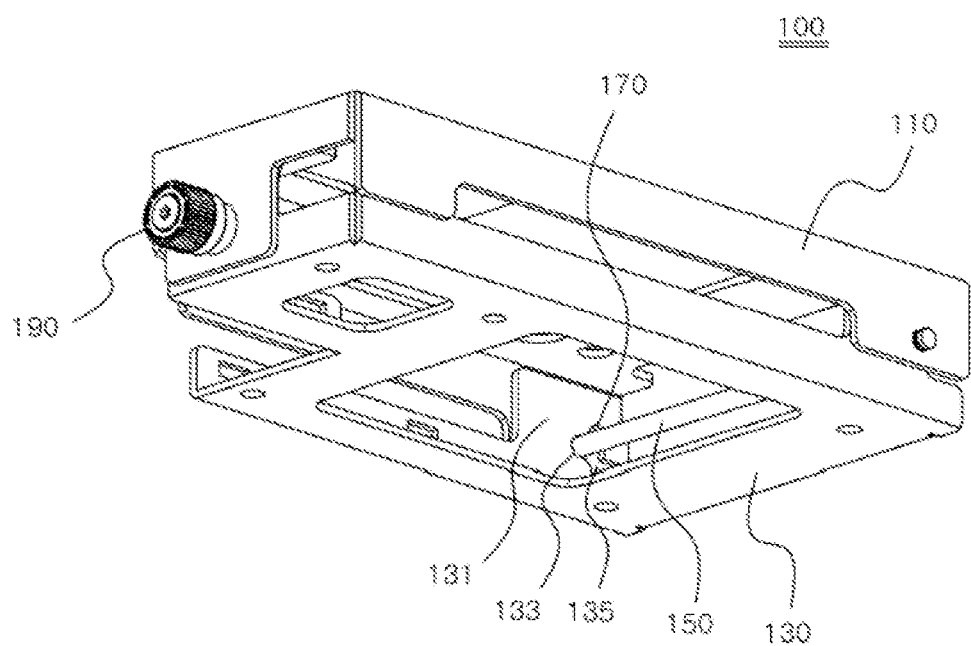
FIGS. 2 and 3 are perspective views of a mount bracket according to the example embodiment.
Figure 3:
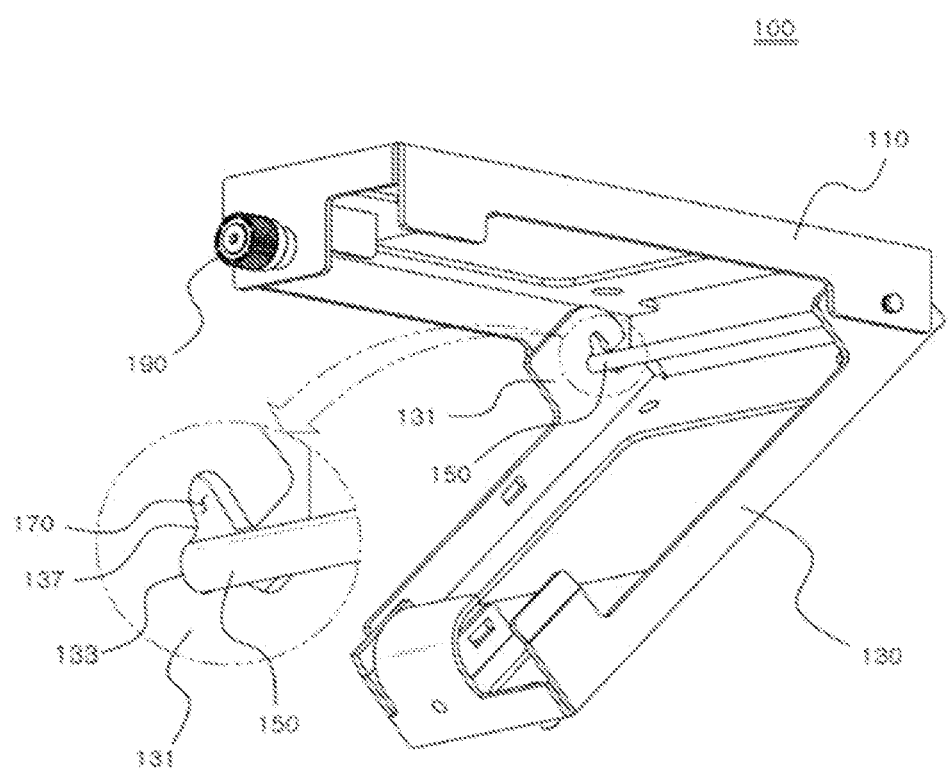

FIGS. 2 and 3 are perspective views of the mount bracket 100 according to the present disclosure, referring to FIGS. 2 and 3, the bracket body 110 includes a plate-shaped plate having a hollow inner space formed therein and a predetermined area, and is coupled to the structure 10 by a fastening member such as a bolt.

The bracket base 130 is rotatably coupled to the bracket body 110 and covers the bracket body 110 as it rotates. In more detail, the bracket base 130 includes a plate-shaped plate, and the communication device 30 is fixedly installed at one side of the plate.

A connection member 150 is provided at one end of the bracket body 110 to rotatably connect the bracket base 130 to the bracket body 110.

In more detail, a rib 131 protruding from the plate is formed at one end of the bracket base 130, and the rib 131 may include a rotating groove 133 in which the connection member 150 of the bracket body 110 is rotatable and a guide groove 135 that guides the connection member 150 to the rotary groove 133 when the connection member 150 is inserted. The guide groove 135 may be bent to be connected to the rotary groove 133, and in this case, the connection member 150 inserted into the rotary groove 133 to rotatably connect the bracket base 130 to the bracket body 110 may be a rotation shaft.

A rotation shaft is provided at one end of the bracket body 110, and the rotation shaft is guided through the guide groove 135 formed in the rib 131 of the bracket base 130 and inserted into the rotary groove 133 formed to be engaged to the guide groove 135, so that the bracket base 130 is rotatably coupled to the bracket body 110. In this case, the bracket body 110 is fixed to the structure 10, and the communication device 30 is connected to one side of the bracket base 130 rotatably attached to the bracket body 110, so that the communication device 30 is installed in the structure 10.

Meanwhile, the bracket base 130 may include an anti-detachment structure for preventing the bracket base 130 to which the communication device 30 is coupled from the bracket body 110 during rotation.

In this case, the anti-detachment structure may be a latching groove 170 formed adjacent to the rotary groove 133 of the bracket base 130 to communicate with the rotary groove 133 and prevents the bracket base 130 from being separated by engaging the connection member 150 when the bracket base 130 is rotated.

Referring to FIG. 3, the latching groove 170 is formed to be communicated to the rotary groove 133 and may be formed adjacent to the rotary groove 133. In this case, the latching groove 170 may be formed to be adjacent to the rotary groove 133 in a direction opposite to the rotating direction of the bracket base 130. When the communication device 30 is installed in the structure 10, the bracket base 130 to which the communication device 30 is coupled and fixed rotates in the direction of gravity by the weight of the communication device 30, and the latching groove 170, formed adjacent to the rotary groove 133 in the direction opposite to the rotating direction of the bracket base 130, prevents the bracket base 130 from being separated from the bracket body 110 by allowing the connection member 150 to be engaged to the latching groove 170 without escaping through the guide groove 135 when the bracket base 130 is rotated. Detailed information included in this will be described later.

Figure 4:
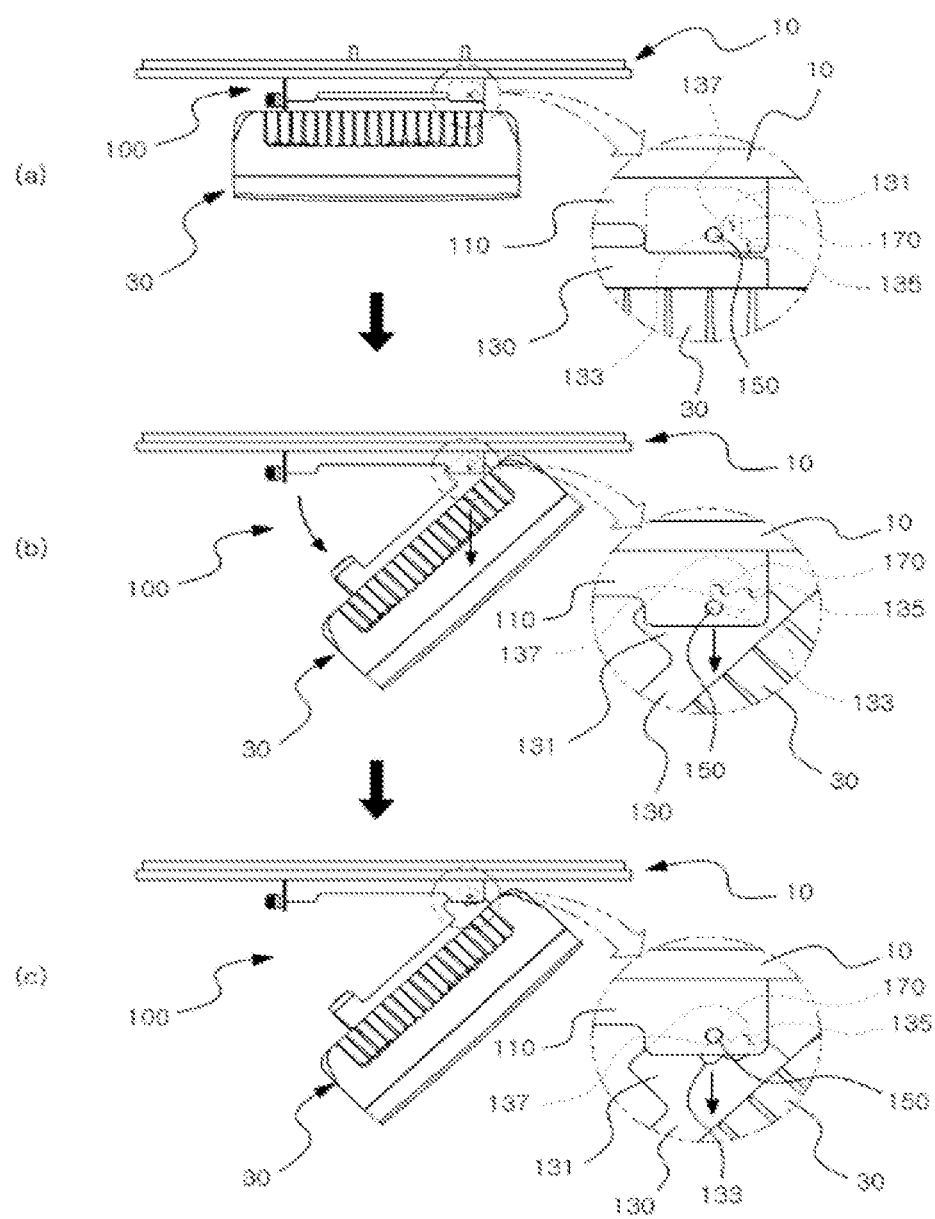
FIG. 4 is a reference diagram for describing a use state in which a mount bracket according to the example embodiment is installed and used on a ceiling.

FIG. 4 is a view for explaining a case where the structure 10 is ceiling and the mount bracket 100 according to the present disclosure is installed and used in the structure 10, and FIG. 4(*a*) shows that the initial communication device 30 is attached to the ceiling using the mount bracket 100. FIG. 4(*b*) shows that the bracket base 130 to which the communication device 30 is coupled rotates in the direction of gravity when the operator releases the fastening screw 190 for work or the fastening screw 190 is not properly fixed. FIG. 4(*c*) shows that the connection member 150 of the bracket body 110 is jammed into the latching groove 170 formed to communicate with the rotary groove 130 so that the bracket base 130 is separated from the bracket body 110 and hung without being dislodged.

Referring to FIG. 4, the latching groove 170 is formed adjacent to the rotary groove 133 in a direction opposite to the rotating direction of the bracket base 130 to be communicated with the rotary groove 133 and is formed between the rotary groove 133 and the guide groove 135. Thereby, when the bracket base 130 is rotated by the gravity of the communication device 30, the connection member 150 formed in the bracket body 110 is not separated from the bracket base 130 along the guide groove 135 of the bracket base 130 but is jammed into the latching groove 170 to prevent the bracket base 130 from being separated from the bracket body 110.

Figure 5:
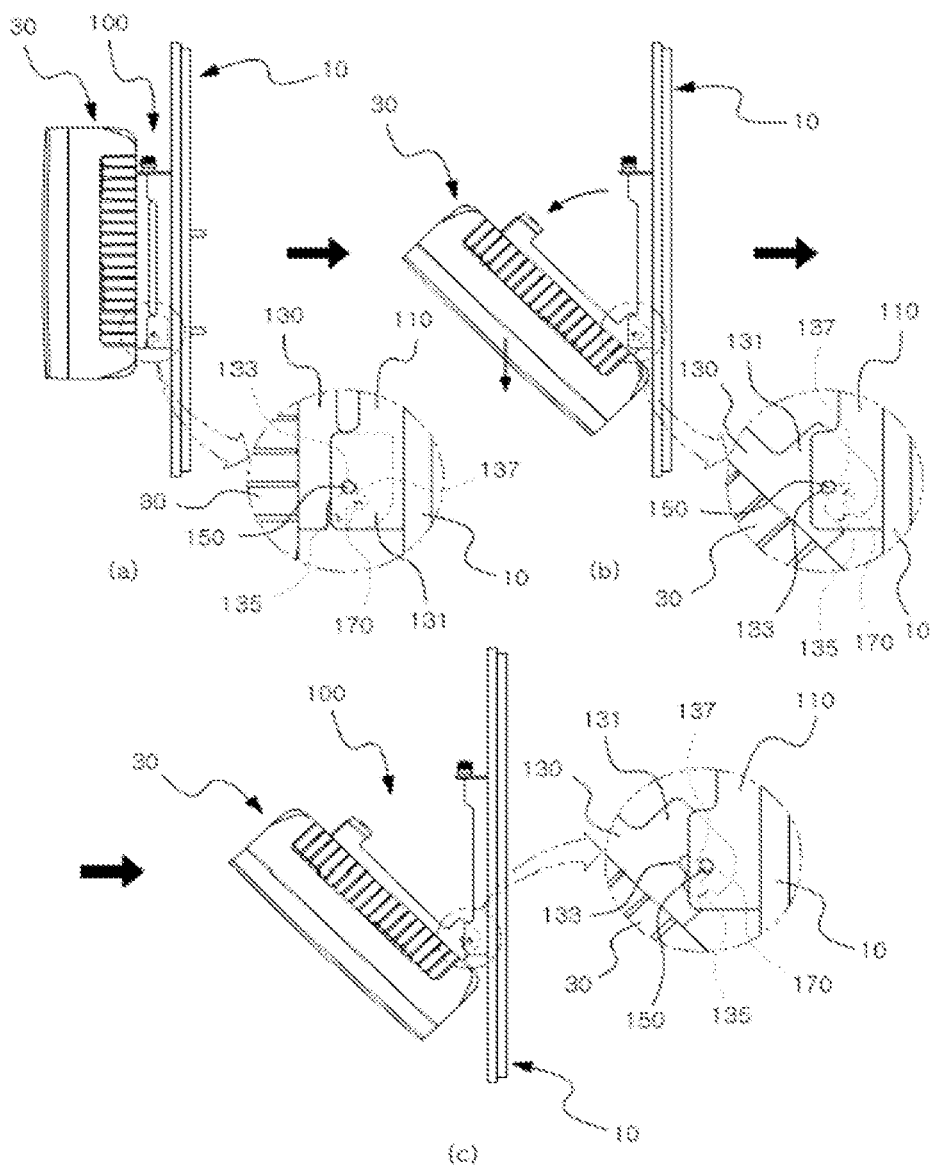
FIG. 5 is a reference diagram for describing a use state in which a mount bracket according to the example embodiment is installed and used on a wall.

FIG. 5 is a view for describing a case where the structure 10 is a wall surface, and the mount bracket 100 according to the present disclosure is installed and used in the structure 10, and FIG. 5(*a*) shows that the initial communication device 30 is fixed to the wall surface using the mount bracket 100. FIG. 5(*b*) shows that the bracket base 130 to which the communication device 30 is coupled rotates in the direction of gravity when the operator releases the fastening screw 190 for work or the fastening screw 190 is not properly fixed. FIG. 5(*c*) shows that the connection member 150 of the bracket body 110 is jammed into the latching groove 170 formed to communicate with the rotary groove 130 so that the bracket base 130 is separated from the bracket body 110 and hung without being detached.

Referring to FIG. 5, the latching groove 170 is formed adjacent to the rotary groove 133 in a direction opposite to the rotating direction of the bracket base 130 to be communicated with the rotary groove 133 and is formed between the rotary groove 133 and the guide groove 135. Thereby, when the bracket base 130 is rotated by the gravity of the communication device 30, the connection member 150 formed in the bracket body 110 is not separated from the bracket base 130 along the guide groove 135 of the bracket base 130 but is jammed into the latching groove 170 to prevent the bracket base 130 from being separated from the bracket body 110.

Meanwhile, according to an embodiment of the present disclosure, a guide protrusion 137 may be formed between the latching groove 170 and the rotary groove 133 to guide the connection member 150 from the rotary groove 133 to the latching groove 170 when the bracket base 130 is rotated.

Figure 6:
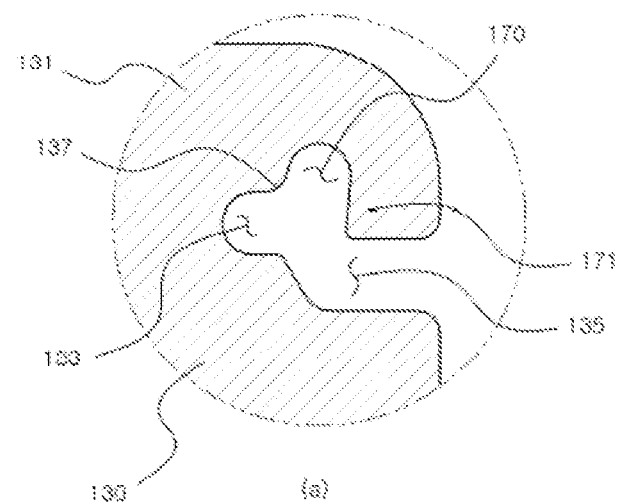
FIG. 6 is a reference diagram for describing a modified example of a mount bracket according to the example embodiment.
Figure 6:
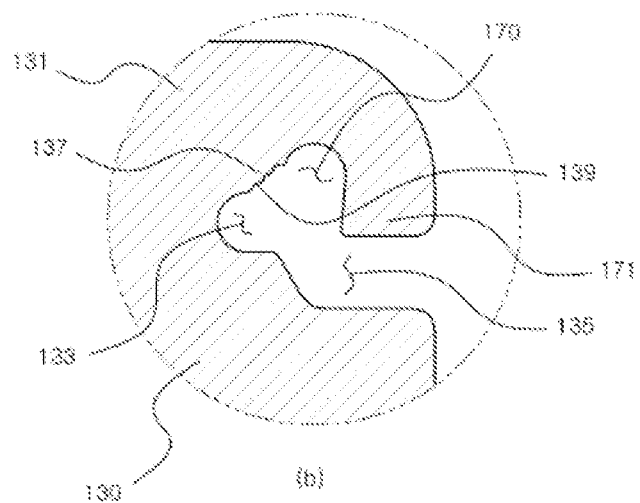

Referring to FIG. 6(*a*), the guide protrusion 137 may be formed to be rounded. In detail, in order to prevent the bracket base 130 from being separated from each other, the connection member 150 formed in the bracket body 110 should be seated in the latching groove 170 as the bracket base 130 rotates, and the guide protrusion 137 is formed between the rotary groove 133 and the latching groove 170 to guide the connection member 150 from the rotary groove 133 to the latching groove 170 and the guide protrusion 137 is formed to be rounded so that the connection member 150 can be stably seated in the latching groove 170.

Meanwhile, an anti-separation jaw 171 may extend from one end of the latching groove 170, and the anti-separation jaw 171 prevents the connection member 150 from being separated from the latching groove 170 by excessively moving to the latching groove 170.

Meanwhile, a plurality of grooves 139 may be formed along the outer periphery of the guide protrusion 137. In more detail, when the bracket base 130 rotates, in case of the connection member 150 rapidly moves from the rotary groove 133 to the latching groove 170, excessive impact may be applied to the connection member 150. By forming the plurality of grooves 139 along the outer periphery of the guide protrusion 137, the connection member 150 can be sequentially moved along the grooves 139, and thus it is possible to alleviate the shock received when the connection member 150 is seated in the latching groove 170.

According to the present disclosure, the mount bracket 100 provides effects to prevent damage to the communication device when the communication device 30 is separated/detached/fallen from the mount bracket 100, then collides with the ground in the process of installing the communication device 30 on the structure 10 such as a wall or a ceiling.

As described above, a preferred embodiment of the mount bracket according to the present disclosure has been described.

It is to be understood that the above-described embodiments are illustrative and non-restrictive in all aspects and that the scope of the present disclosure is indicated by the appended claims rather than the foregoing description. And all changes or modifications that come within the inventive concept and scope of the appended claims are intended to be embraced within their scope.

What is claimed is:

1. A mount bracket for installation of communication device in a structure, the mount bracket comprising:
   a bracket body coupled to the structure;
   a bracket base, to which the communication device is fixed, coupled to the bracket body and rotates to cover the bracket body; and
   a connection member provided at one end of the bracket body to rotatably connect the bracket base to the bracket body,
   wherein the bracket base includes an anti-detachment structure for preventing separation from the bracket body during rotation,
   wherein the bracket base further comprises a rib formed at one end of the bracket base, and a rotary groove formed in the rib and into which the connection member of the bracket body is rotatably inserted, wherein the anti-detachment structure is a latching groove and the latching groove is formed adjacent to be connected to the rotary groove of the bracket base, wherein the connection member is moved from the rotary groove to the latching groove when the bracket base is rotated, and wherein a guide protrusion is formed between the latching groove and the rotary groove to guide the connection member from the rotary groove to the latching groove when the bracket base is rotated.

2. The mount bracket of claim 1, wherein the bracket base further comprises:

a guide groove formed in the rib and configured to guide the connection member to the rotary groove when the connection member is inserted.

3. The mount bracket of claim 1, wherein
the guide protrusion is formed to be rounded.

4. The mount bracket of claim 1, wherein
a fastening screw for fixing the bracket base to the bracket body is provided on the other end of the bracket body.

5. The mount bracket as claimed in claim 2, wherein
the latching groove is formed between the rotary groove and the guide groove, and,
the latching groove is formed in a clockwise or counter-clockwise position of the rotary groove.

6. The mount bracket of claim 3, wherein
a plurality of grooves are formed along an outer periphery of the guide protrusion.

\* \* \* \* \*